US005452360A

United States Patent [19]

Yamashita et al.

[11] Patent Number: 5,452,360

[45] Date of Patent: Sep. 19, 1995

[54] SOUND FIELD CONTROL DEVICE AND METHOD FOR CONTROLLING A SOUND FIELD

[75] Inventors: Shinjiro Yamashita; Yasushi Shimizu, both of Hamamatsu, Japan

[73] Assignee: Yamaha Corporation, Hamamatsu, Japan

[21] Appl. No.: 336,012

[22] Filed: Nov. 8, 1994

Related U.S. Application Data

[63] Continuation of Ser. No. 69,447, May 28, 1993, abandoned, which is a continuation of Ser. No. 662,203, Feb. 27, 1991, abandoned.

[30] Foreign Application Priority Data

Mar. 2, 1990 [JP] Japan .................................... 2-51200

[51] Int. Cl.[6] ................................................ H03G 3/00

[52] U.S. Cl. ........................................... 381/63; 381/82

[58] Field of Search ................... 381/1, 17, 63, 82, 83, 381/93

[56] References Cited

U.S. PATENT DOCUMENTS

| | | | |
|---|---|---|---|
| 4,237,343 | 12/1980 | Kurtin et al. | 381/63 |
| 4,593,404 | 6/1986 | Bolin | 381/82 |
| 4,731,848 | 3/1988 | Kendall et al. | 381/63 |
| 4,937,875 | 6/1990 | Hayashi | 381/63 |
| 5,142,586 | 8/1992 | Berkhout | 381/63 |

FOREIGN PATENT DOCUMENTS

| | | |
|---|---|---|
| 54-145501 | 11/1979 | Japan . |
| 61-261997 | 11/1986 | Japan . |
| 62-186590 | 11/1987 | Japan . |

*Primary Examiner*—Forester W. Isen
*Attorney, Agent, or Firm*—Spensley Horn Jubas & Lubitz

[57] ABSTRACT

A sound field control device for simulating a sound field of a small space such as a concert hall in a large space such as an open outdoor space and a large indoor space comprises loudspeakers for controlling a sound field disposed at or in the vicinity of positions in a real space corresponding to positions on a hypothetical peripheral plane which defines a hypothetical space in the real space, and a hypothetical reflected sound synthesizing section for synthesizing hypothetical reflected sounds on the basis of the sounds from a real sound source and supplying the synthesized hypothetical reflected sounds to the loudspeakers. The hypothetical reflected sounds are synthesized so that they will simulate sounds which are emanated from the real sound source and reflected from the hypothetical peripheral plane of the hypothetical space. A natural sound field in which one feels as if he was in an indoor concert hall can be obtained in the whole hypothetical space.

19 Claims, 8 Drawing Sheets

(REAL CONCERT HALL)

(HYPOTHETICAL CONCERT HALL)

SOUND FIELD CONTROL DEVICE AND METHOD FOR CONTROLLING A SOUND FIELD

This is a file wrapper continuation of application Ser. No. 08/069,447 filed on May 28, 1993, which is a file wrapper continuation of application Ser. No. 07/662,203, filed on Feb. 27, 1991, both now abandoned.

BACKGROUND OF THE INVENTION

This invention relates to a sound field control device and method for simulating a sound field of a small space such as a concert hall in a large space such as an open outdoor space and a large space inside of a building.

It is important in an acoustic design for a concert hall designed mainly for performance of classical music to pay much attention to the structure and the influence of reflected sounds in order to facilitate listening of each performer on the stage to his own performance and also other's performance and maintain acoustic characteristics concerning "reverberation", "loudness", "spatialimpression" etc.

Since it is difficult to obtain such reflected sounds in an outdoor space, it is necessary to synthesize necessary reflected sounds electrically and create a sound field having naturalness which will satisfy both performers and audience.

FIG. 2 shows a conventional sound field control device in an outdoor concert site. This outdoor concert site has a stage 14. The stage 14 is surrounded by a wall 10 in its top and bottom, both sides and back portion and is open in the direction of front audience seats 12. The audience seats 12 are not surrounded by a wall but are completely open.

Microphones 18 are set close to musical instruments 16 on the stage 14. Main loudspeakers 20 and 22 are provided on both sides of the stage 14 and auxiliary loudspeakers 24 and 26 are provided outside of the main loudspeakers 20 and 22. The main loudspeakers 20 and 22 function to add reverberation to sounds from the stage 14 and constitutes a so-called PA (public address) device. The auxiliary loudspeakers 24 and 26 supplement tone volume for the main loudspeakers 20 and 22.

Inside or in the vicinity of the audience seats 12 is provided an input adjusting table (mixing console) 28. Sounds collected by the microphones 18 are applied to the input adjusting table 28 where they are adjusted in level by operation of an operator (mixer). The sounds are then imparted with reverberation by echo machines 30 and 32 and thereafter are propagated from the main loudspeakers 20 and 22 and the auxiliary loudspeakers 24 and 26.

The conventional sound field control device shown in FIG. 2 has the following problems:

(1) Since the operator creates a sound field on the basis of his own acoustic impression, the sound field thus created often becomes different from a sound field which musicians and conductors desire to create.

(2) Since acoustic similarity between the audience seats 12 and the s rage 14 is insufficient, the sound field created by this device becomes different from a sound field in a general indoor concert hall.

(3) The operation of the input adjusting table is complicated.

(4) Determination of reverberation and other characteristics at the adjustment stage has to rely solely on the operator's acoustic impression and hence it is difficult to attain an objectively correct determination of these characteristics.

(5) Since the electric reverberation imparting device (i. e. , the echo machines 30 and 32) is employed, the sound field is liable to be affected by coloration.

It is, therefore, an object of the invention to provide a sound field control device and a method for controlling a sound field which have eliminated the above described disadvantages of the conventional sound field control device and are capable of readily creating a natural sound field simulating a real indoor concert hall in an outdoor space.

SUMMARY OF THE INVENTION

For achieving the above described object, the sound field control device for simulating a hypothetical space in a real space having a real sound source comprises a loudspeaker for controlling a sound field disposed at or in the vicinity of a position in the real space corresponding to a position on a hypothetical peripheral plane which defines the hypothetical space, and a hypothetical reflected sound synthesizing section for synthesizing a hypothetical reflected sound on the basis of a sound from the real sound source and supplying the synthesized hypothetical reflected sound to the loudspeaker, the hypothetical reflected sound being synthesized so that the hypothetical reflected sound simulates a sound which is emanated from the real sound source and reflected at the position on the hypothetical peripheral plane of the hypothetical space.

According to the invention, a central position of a stage, for example, is used as a real sound source position in a hypothetical space. Sounds emanated from this real sound source position and reflected from the hypothetical peripheral plane of the hypothetical space are synthesized by the hypothetical reflected sound synthesizing section and propagated from the loudspeakers for controlling the sound field which are disposed at or in the vicinity of positions in the real space corresponding to positions on the hypothetical peripheral plane whereby a natural sound field in which one feels as if he was in a real indoor concert hall can in be obtained in the whole hypothetical space. Accordingly, the following advantages can be obtained by the device of the invention:

(1) A reflected sound structure simulating an indoor concert hall can be created and reproduced in a large space such as an outdoor space.

(2) The acoustic similarity between the audience seats and stage is improved and the same reverberation can be provided both on the stage and the audience seats.

(3) Since the reflected sound structure is objectively determined by simulation using, e.g., the computer aided design (CAD), acoustic characteristics such as reverberation need no longer be-determined soley by the operator's acoustic impression but can be adjusted objectively and in a short time.

(4) A more natural reflected sound than one obtained by reverberation imparted by the echo machines can be obtained.

Preferred embodiments of the invention will now be described with reference to the accompanying drawings.

BRIEF DESCRIPTION OF THE DRAWINGS

In the accompanying drawings.

DESCRIPTION OF PREFERRED EMBODIMENTS

Before explaining about embodiments of the invention, the fundamental principle of the invention will be described.

Figure 3:
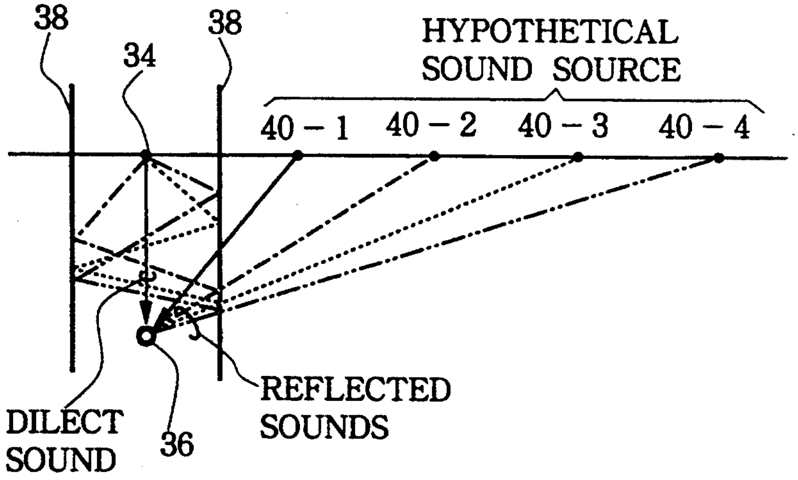
FIGS. 3 to 5 are diagrams for explaining the fundamental principle of the invention.

FIG. 3 shows a state of reflected sounds in an indoor space. Sounds emanated from a real sound source 34 reach a sound receiving point 36 as a direct sound and also as sounds reflected from walls 38. The reflected sound structure is determined by positions of plural hypothetical sound sources 40-1, 40-2, etc. relative to the real sound source 34 and consists of a composition of sound wave fronts arriving from the hypothetical sound sources 40-1, 40-2 etc.

Figure 4:
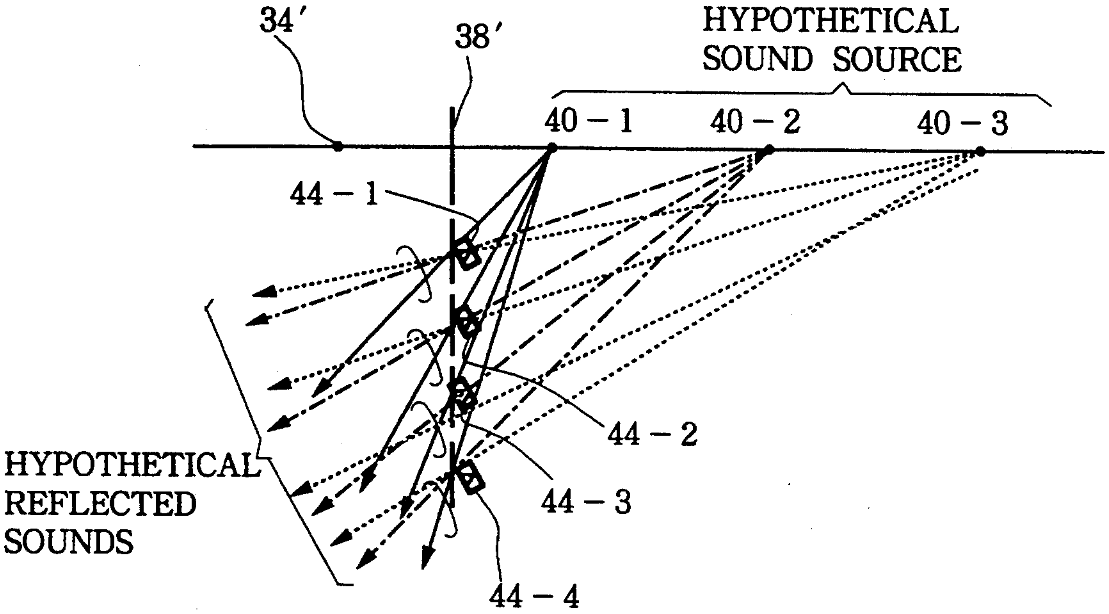

It is, therefore, possible to realize an acoustic synthesis (sound field in a hypothetical space) covering the whole area of the audience seats by assuming a hypothetical hall to simulate in a real space such as an outdoor concert site, dividing a hypothetical wall 38' of the hypothetical hall as shown in FIG. 4, simulating sound wave fronts from hypothetical sound sources 40-1, 40-2 etc. relative to an assumed real sound source position 34' (e.g., a central position of a stage of the hypothetical hall) by means of loudspeakers 44-1, 44-2 etc. disposed at each divided position of the hypothetical wall 38' and performing the same processing for all hypothetical walls (i.e., both side walls and, if necessary, ceiling and back wall) of the hypothetical hall).

Figure 5:
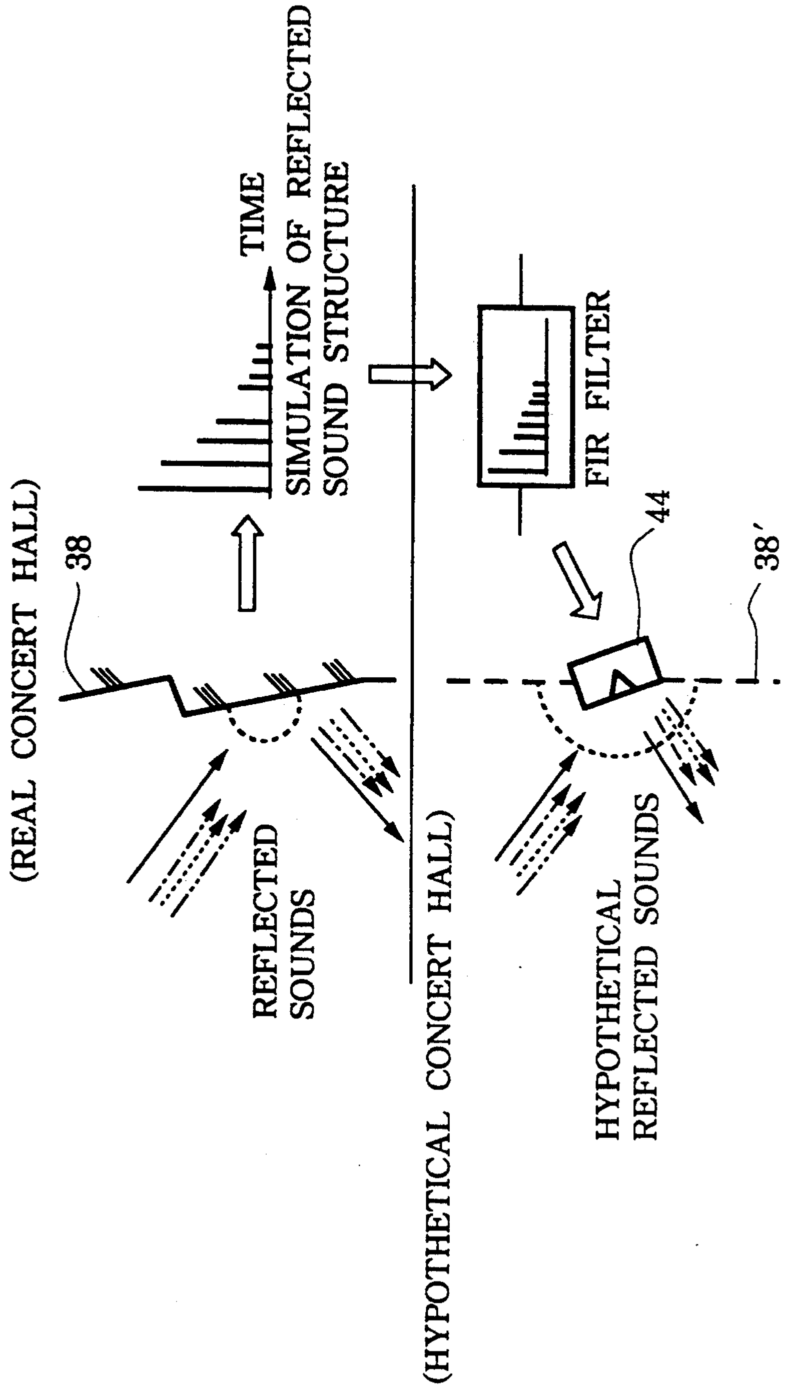

More specifically, as shown in FIG. 5, delay time information and amplitude information of each hypothetical reflected sound are obtained by computation employing the computer aided design (CAD) or computation based on actual measurement of impulse response at each wall surface of a real indoor concert hall on the basis of the positions of the hypothetical sound sources 40-1, 40-2 etc. and the respective divided positions of the hypothetical wall 38'. Time structure (characteristics) information of each sound wave front is obtained by this computation and this time structure information is applied to an FIR (finite impulse response, non-circulating type) filter as parameters and a source signal is subjected to a convolution operation by the FIR filter with the parameters. An output signal of the filter is emanated from the loudspeakers 44-1, 44-2 etc. (the direction of emanating a sound is substantially coincidental with the direction of reflected sound from the hypothetical wall 38') and the acoustic image of a hypothetical wall or ceiling is thereby created and the assumed indoor concert hall is simulated.

Figure 6:
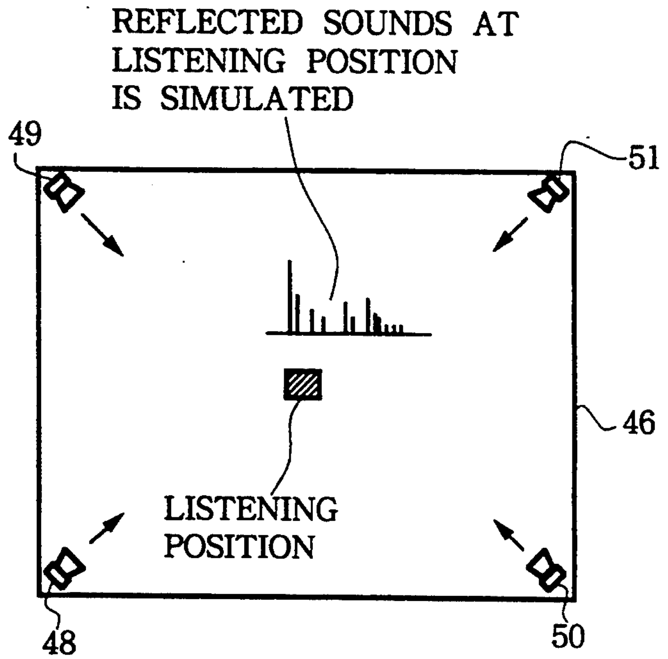
FIG. 6 PRIOR ART
FIGS. 6 and 7 are diagrams for explaining difference between a sound field control device used in a narrow indoor space and the sound field control device according to the invention.

There has been a prior art sound field control device which simulates a sound field of a concert hall or the like site in a narrow room such as a listening room. According to this device, as shown in FIG. 6, loudspeakers 48 to 51 for a surrounding effect are disposed at four corners of a room 46, a single listening point to be reproduced is assumed and a reflected sound structure at this position is simulated on the basis of impulse responses of all directions which have been measured at a specific listening position in a real concert hall to reproduce the sound field of the real corner hall. This prior art device however has the disadvantage that there is only one listening position and hence a suitable listening area is limited.

Figure 7:
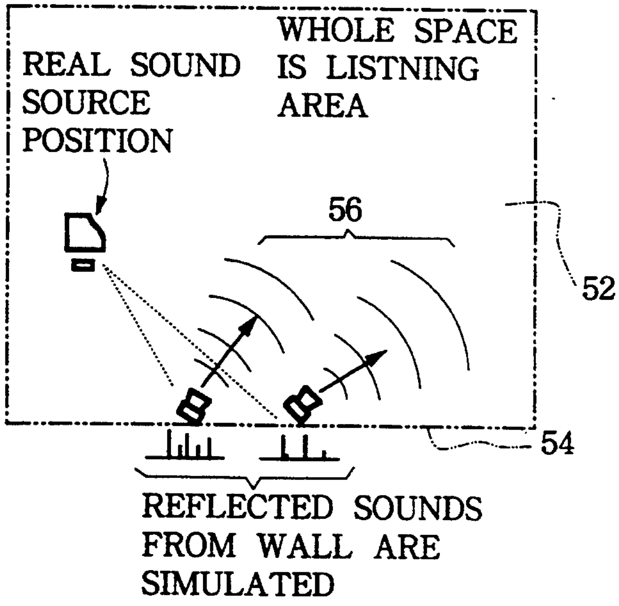

In contrast thereto, the device according to the invention simulates, as shown in FIG. 7, a hypothetical reflected sound 56 from a hypothetical wall 54 in a hypothetical concert hall 52 and does not intend to reproduce a specific listening point and, accordingly, a sufficiently large listening area can be secured.

Figure 1:
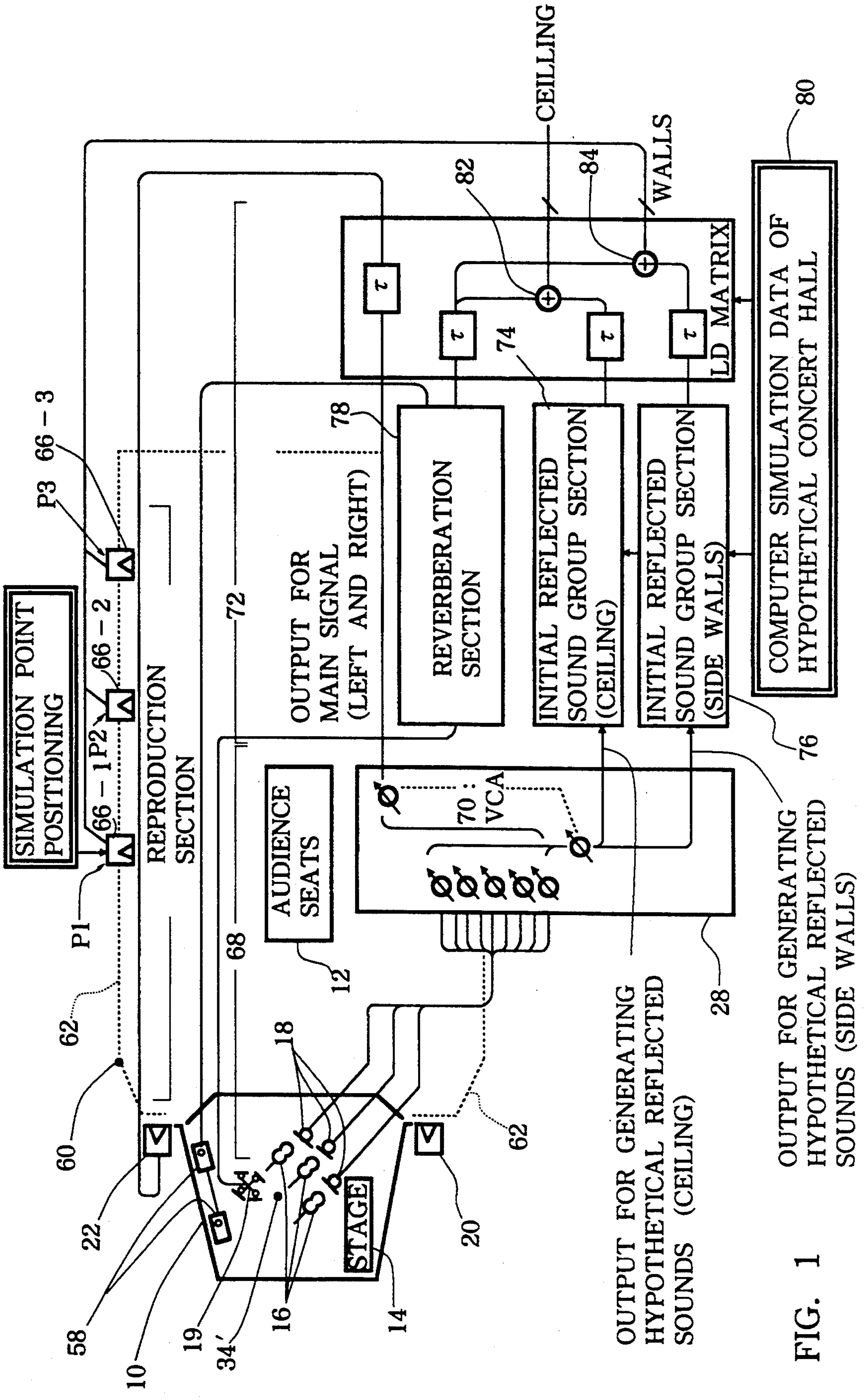
FIG. 1 is a block diagram showing an embodiment of the invention.
Figure 2:
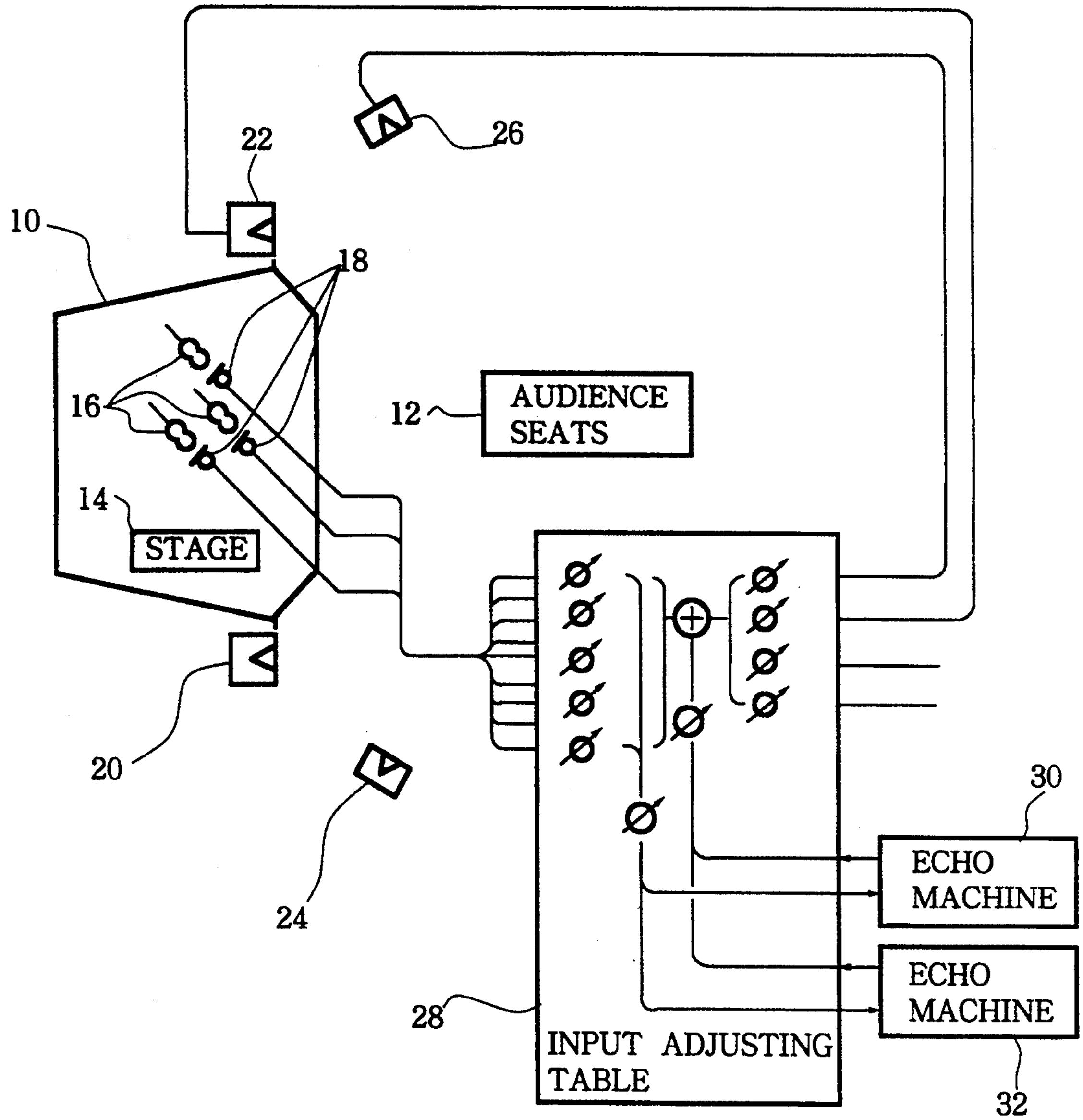
FIG. 2 PRIOR ART
FIG. 2 is a block diagram showing a conventional sound field control device (PA device)

FIG. 1 shows an embodiment of the invention applied to an outdoor concert site. This outdoor concert site has a stage 14 which is surrounded by a wall 10 in its top and bottom, both sides and back portion and is open in the direction of front audience seats 12. The audience seats 12 are not surrounded by a wall but are completely open.

In this embodiment, it is assumed that the stage 14 is a stage position of a hypothetical concert hall 60 and the central position of the stage 14 is a real sound source position 34'. Simulation points P1, P2 etc. are determined and loudspeakers for controlling a sound field are provided at or in the vicinity of these position. The direction of emanation of sound from each of these loudspeakers is determined to be substantially coincidental with the direction of reflection of a hypothetical reflected sound. A reflected sound structure at each of the simulation points P1, P2 etc. relative to the real sound source position 34' is computed by a suitable computation method such as the computer aided design (CAD) and applied to an FIR filter. A source signal is subjected to a convolution operation in the FIR filter to synthesize hypothetical reflected sounds at the respective simulation points P1, P2 etc. and these hypothetical reflected sounds are supplied to corresponding loudspeakers provided for controlling a sound field to reproduce a hypothetical concert hall.

Microphones 18 are set close to musical instruments 16 on the stage 14 and a quadraphonic-microphone 19 is set at a predetermined position on the stage 14. Stage loudspeakers 58 are also provided on the stage 14 and main loudspeakers 20 and 22 are provided at left and right positions outside of the stage 14. The main loudspeakers 20 and 22 function to add reverberation to sounds from the stage 14 and constitutes a PA device. The quadraphonic-microphone 19 and the stage loudspeakers 58 are used for generating reverberation sound by utilizing an electric feedback with an inside acoustic system on the stage 14.

A hypothetical wall 62 of the hypothetical concert hall 60 is assumed to exist about the audience seats 12 and simulation points P1, P2, P3 etc. are determined along side wall portions and a ceiling portion of the hypothetical wall 62. Sub-loudspeakers 66-1, 66-2, 66-3 etc. are disposed at or in the vicinity of these simulation points P1, P2, P3 etc. In this embodiment, the musical instruments 16 are disposed at the real sound source position 34' which is assumed to exist on the stage 14 and hypothetical reflected sound signals are generated on the basis of signals collected by the microphones 18.

The height of the sub-loudspeakers 66-1, 66-2 etc. at each side wall of the hypothetical wall 62 is determined in the following manner. Since the reproducing area of each of the sub-loudspeakers 66-1, 66-2 etc. relative to the audience seats 12 is determined when the position (horizontal toward) of these sub-loudspeakers has been determined, the height of a reflected wall position which is considered to be important acoustically can be substantially computed. The sub-loudspeakers 66-1 etc. may suitably be set at this computed height corresponding to each set position of the sub-loudspeakers.

An input section 68 supplies a signal collected by the microphones 18 to an input adjusting table 28 where the signal is adjusted in its level by the operation performed by an operator to provide an output for generating a main signal which is imparted with reverberation and an output for generating a hypothetical reflected sound. The level of the output for generating the main signal and the level of the output for generating the hypothetical reflected sound are adjusted by interlocked VCAs (voltage control led amplifiers) 70 while maintaining a constant level ratio. The ratio of level of the output for the main signal and the output for the reflected sound is adjusted by the input adjusting table 28.

A hypothetical reflected sound synthesizing section 72 generates a hypothetical reflected sound on the basis of a signal provided by the input adjusting table 28. In the hypothetical reflected sound synthesizing section 72, initial reflected sound synthesizing portions 74 and 75 etc. are formed by multi-channel FIR filters (for side wall and ceiling) inputting initial reflected sound group data at the position of the respective sub-loudspeakers 66-1, 66-2 etc. in the hypothetical concert hall 60 (i.e. simulation points). The output for generating the hypothetical reflected sound from the input adjusting table 28 is applied to these FIR filters 74 and 76 etc. and subjected to the convolution operation to create an initial reflected sound (hypothetical reflected sound) at each hypothetical wall position.

A reverberation sound synthesizing section 78 synthesizes a reverberation sound by utilizing an electric-acoustic feedback loop between the quadraphonic-microphone 19 and the stage loudspeakers 56 on the stage 14. By using the quadraphonic-microphone, stabilization of acoustic feedback can be achieved.

An L/D (level delay) matrix 80 comprises delay circuits, level adjusting circuits and adders to perform functions including time matching, level adjustment and mixing. The output for the main signal provided by the input adjusting table 28 is subjected to delay, if necessary, and supplied to the main loudspeaker 22 to be propagated therefrom. This reproduced sound is adjusted so as to be oriented at the assumed real sound source position 34'. The adders 82 and 84 add the reverberation sound generated by the reverberation sound generation section 78 to the hypothetical reflected sound generated by the initial reflected sound group sections 74 and 76 and supply the outputs of addition to the corresponding sub-loudspeakers 66-1, 66-2 etc. to be emanated therefrom. In this case, the hypothetical reflected sound and the reverberation sound are subjected to delay corresponding to time obtained by dividing the distances between the real sound source position 34' and the positions of the sub-loudspeakers 66-1, 66-2 etc. by the sound velocity. The hypothetical concert hall 60 is thereby simulated.

A specific example of a manner of setting the sub-loudspeakers 66-1, 66-2 etc. for controlling a sound field and a specific example of the initial reflected sound group applied to the multi-channel FIR filters of the initial reflected sound group sections 74 and 76 will now be described.

Figure 8:
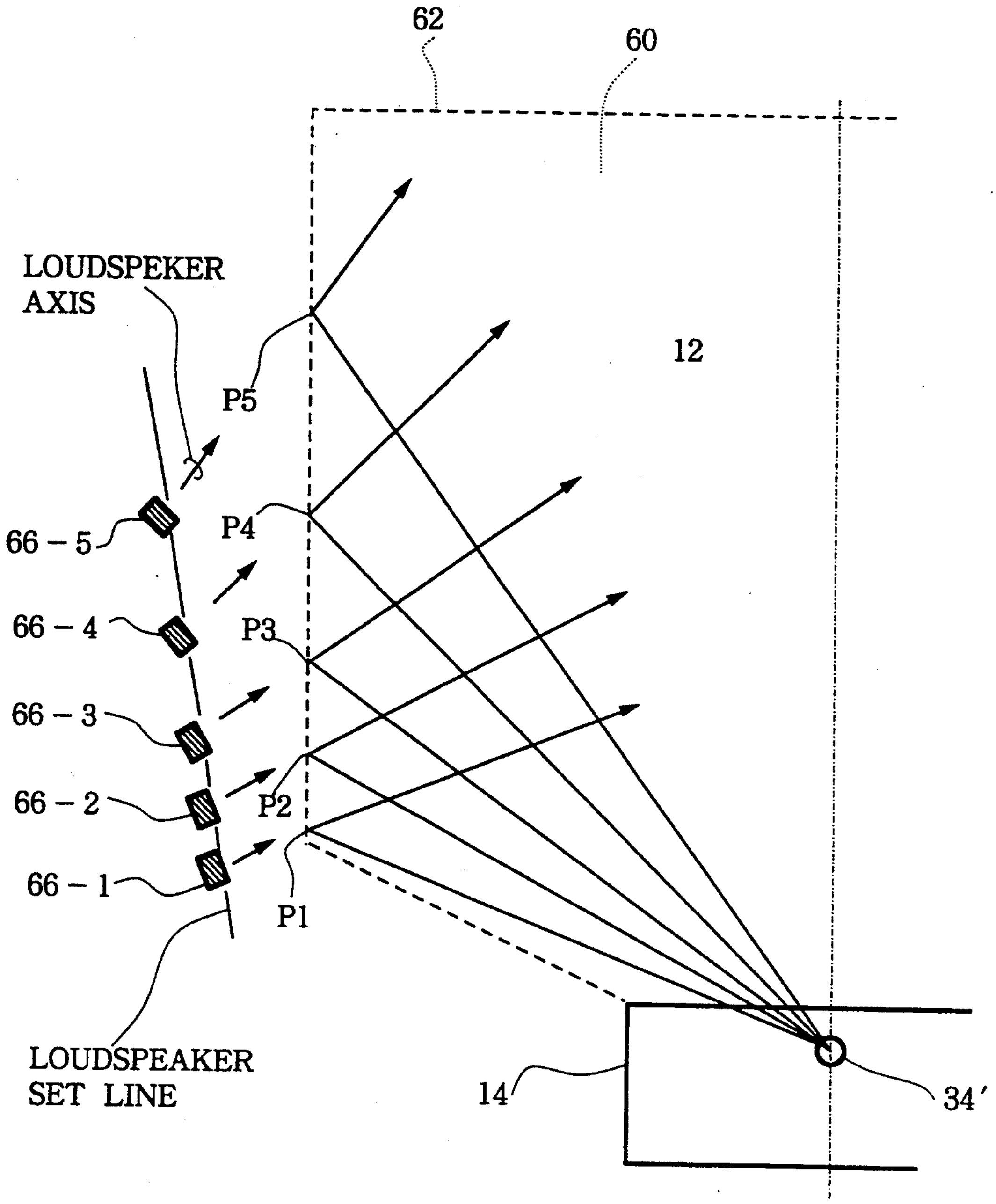
FIG. 8 is a plan view showing a specific example of a manner of setting sub-loudspeakers in a hypothetical hall according to the invention.

FIG. 8 shows a specific example of a manner of setting the sub-loudspeakers 66-1, 66-2 etc. In this example, the sub-loudspeakers 66-1, 66-2 etc. of a limited number are effectively arranged. Initial reflected sound group (mainly primary and secondary reflections) which are particularly important in the indoor acoustic design has a reflecting point mainly at the side wall portions near the stage 14 and there is only little reflected sound from the side wall portions remote from the stage 14 to be supplied to the main portion of the audience seats 12. For this reason, the simulation points P1, P2 etc. of the hypothetical concert hall 60 are determined not by equally dividing the hypothetical wall 60 but with a closer interval toward the real sound source 34'.

Since the simulation points P1, P2 etc. are assumed to have a wave front of a limited magnitude (area) while an actual reflected sound from a wall is a planer wave, the sub-loudspeakers 66-1, 66-2 etc. are disposed outside of the simulation points P1, P2 etc. to reproduce the sound from the sub-loudspeakers as a planer wave as much as possible. By this arrangement, the wave front of the reproduced sound is expanded and thereby more closely simulates a planer wave.

Figure 9A:
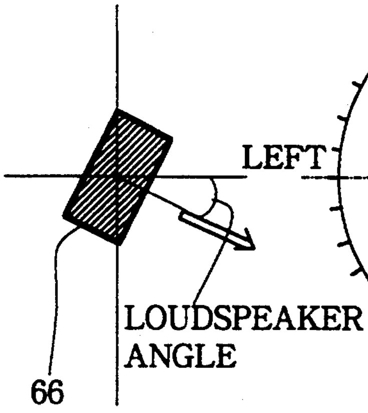
FIGS. 9A and 9B and 10A and 10B are diagrams for explaining directions of setting of sub-loudspeakers for controlling a sound field.
Figure 9B:
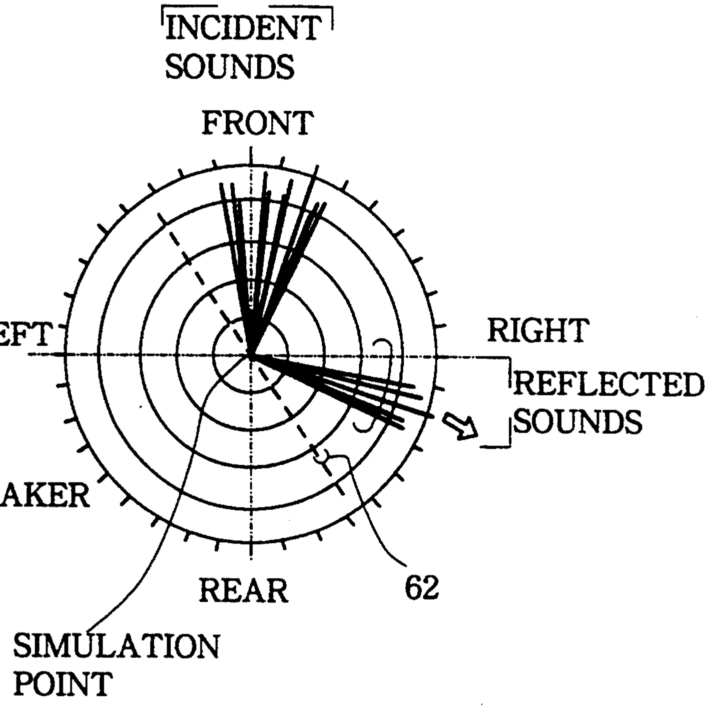
Figure 10A:
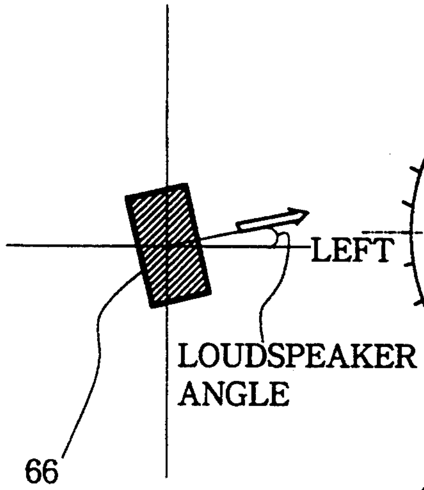
Figure 10B:
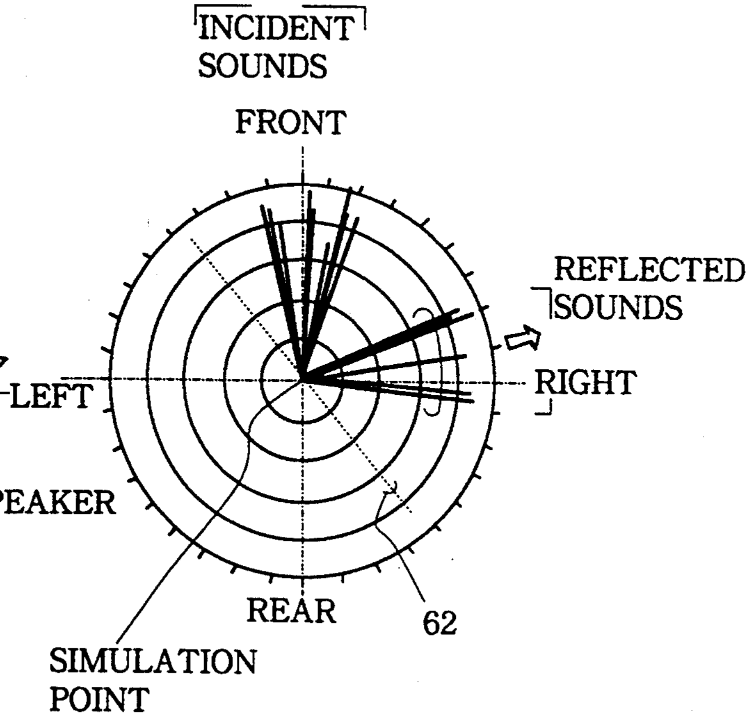

Results of analysis by the computer aided design (CAD) shown in FIGS. 9A and 10A show that the direction of reflection at each of the simulation points P1, P2 etc. is determined depending substantially upon the angle of incident sound with respect to the hypothetical wall 62. Accordingly, as shown in FIGS. 9B and 10B, the sub-loudspeaker 66 is disposed in such a manner that its direction of emanating a sound becomes the same as the direction of reflection. As a result, the angle of each of the sub-loudspeakers 66-1, 66-2 etc. is determined as shown in FIG. 8.

Figure 11:
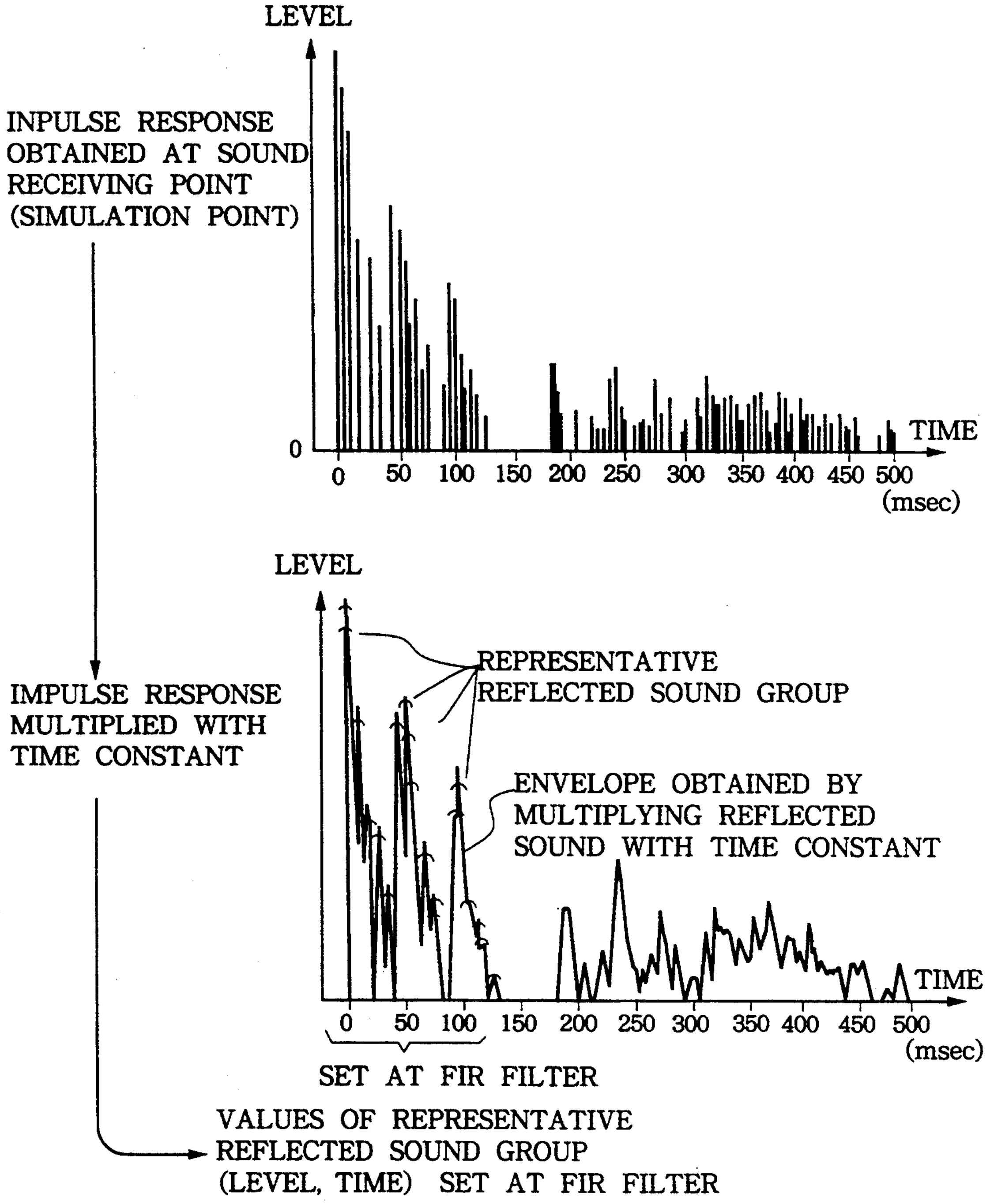
FIG. 11 is a diagram for explaining parameters of a reflected sound group in an FIR filter.

FIG. 11 shows a manner of determining the initial reflected sound group information applied to the multi-channel FIR filters constituting the initial reflected sound group sections 74 and 76. The FIR filters create finite reflected sound information and cannot subject all impulse response obtained by the simulation to the convolution operation. Hence, as shown in FIG. 11, representative reflected sound group information are sampled from an envelope shape obtained by multiplying initial reflected sounds to 100 ms which are important in hearing with time constant and parameters of the FIR filters are set on the basis of the sampled reflected sound group.

In the above described embodiment, the hypothetical reflected sound structure on the hypothetical wall of the hypothetical concert hall is computed by the computer aided design (CAD). Alternatively, the hypothetical reflected sound structure may be obtained by other methods such, for example, as measuring impulse response at each wall position to impulse generated on a stage of a real concert hall by the closely located four point microphone method.

In the above embodiment, the main loudspeakers are used. The main loudspeakers, however, may be omitted if tones from the musical instruments themselves are large enough to obviate amplification of the tones.

In the above described embodiment, description has been made with respect to a case where the application is applied to an outdoor concert site. The invention is applicable also to a case where a real performer does not exist at an assumed real sound source position, e.g., an outdoor movie theatre and an outdoor record concert site. In this case, adjustment may be made so that reproduced sounds from main loudspeakers will be oriented at an assumed real sound source position.

The invention is applicable not only to an outdoor space but to a case where a small indoor space such as a small concert hall is simulated in a larger indoor space.

What is claimed is:

1. A sound field control device for simulating a hypothetical space in a real space having a real sound source comprising:

a loudspeaker for controlling a sound field disposed at or in the vicinity of a position in the real space corresponding to a position on a hypothetical peripheral plane which defines the hypothetical space; and a hypothetical reflected sound synthesizing section for synthesizing a hypothetical reflected sound on the basis of a sound from the real sound source and supplying the synthesized hypothetical reflected sound to the loudspeaker, the hypothetical reflected sound being synthesized so that the hypothetical reflected sound simulates a sound which is emanated from the real sound source and reflected at the position on the hypothetical peripheral plane of the hypothetical space;

there being a plurality of positions on the hypothetical peripheral plane at which or in the vicinity of which a plurality of the loudspeakers are disposed, the positions being determined with a closer interval toward the real sound source.

2. A sound field control device as defined in claim 1, wherein the hypothetical reflected sound is synthesized by simulating a reflected sound and generating a reverberation sound using a sound feedback loop including a stage space and combining the reflected sound and the reverberation sound to produce a hypothetical sound field.

3. A sound field control device as defined in claim 2 wherein the hypothetical reflected sound is synthesized so that the hypothetical reflected sound has a delay time and a gain which are substantially the same as those of the sound emanated from the real sound source and reflected at the position on the hypothetical peripheral plane of the hypothetical space.

4. A sound field control device as defined in claim 2 wherein the hypothetical sound synthesizing section comprises an finite impulse response filter.

5. A sound field control device as defined in claim 2 wherein the hypothetical space is a hypothetical hall and the hypothetical peripheral plane comprises a hypothetical wall and a hypothetical ceiling of the hypothetical hall.

6. A sound field control device as defined in claim 2 wherein the loudspeaker is disposed in such a manner that a direction of a sound emanated from the loudspeaker becomes substantially the same as a direction of which the sound from the real sound source is reflected at the position on the hypothetical peripheral plane of the hypothetical space.

7. A sound field control device as defined in claim 2 wherein the loudspeaker is disposed outside of the positions on the hypothetical peripheral plane.

8. A sound field control device as defined in claim 2 which further comprises a loudspeaker for emanating directly the sound from the real sound source.

9. A sound field control device as defined in claim 2 which further comprises a loudspeaker, a microphone picking up a sound from the loudspeaker, and a delay circuit which delays a signal supplied from the microphone and applies a delayed signal to the loudspeaker, so that an acoustic feedback system is carried out.

10. A sound field control device for simulating a hypothetical space in a real space having a real sound source, comprising:

a plurality of loudspeakers being respectively discretely disposed at or in the vicinity of a position in the real space corresponding to a position on a hypothetical peripheral plane which defines the hypothetical space;

hypothetical reflected sound source synthesizing means for synthesizing a plurality of hypothetical reflected sound source signals, the plurality of hypothetical reflected sound source signals being different from each other and respectively corresponding to said plurality of loudspeakers; and supplying means for respectively supplying the plurality of hypothetical reflected sound source signals to said corresponding loudspeakers, wherein a hypothetical reflected sound simulates a sound which is emanated from the real sound source and reflected at the position on the hypothetical peripheral plane of the hypothetical space;

a plurality of simulation points at which said plurality of loudspeakers are respectively disposed being determined not to equally divide the hypothetical peripheral plane but with a closer interval toward the real sound source.

11. A sound field control device as defined in claim 10, wherein the hypothetical reflected sound source synthesizing means synthesizes a plurality of hypothetical reflected sound source signals by simulating a reflected sound and generating a reverberation sound using a sound feedback loop including a stage space and combining the reflected sound and the reverberation sound to produce a hypothetical sound field.

12. A sound field control device as defined in claim 11, wherein said hypothetical reflected sound source synthesizing means comprises:

a memory for storing a plurality of parameters, each parameter representing a characteristic of a hypothetical reflected sound at a position on the hypothetical peripheral plane; and an FIR filter for convolution-operating a sound signal from the real sound source in accordance with one of the parameters to form one of the plurality of hypothetical reflected sound source signals.

13. A sound field control device as defined in claim 12, wherein one of the parameters comprises delay time information and amplitude information of the hypothetical reflected sound.

14. A sound field control device as defined in claim 13, wherein the hypothetical reflected sound includes an initial reflected sound group.

15. A sound field control device as defined in claim 11, wherein said plurality of loudspeakers are disposed outside of the hypothetical peripheral plane.

16. A sound field control device as defined in claim 11, further comprising reverberation sound generation means for generating the reverberation sound on the basis of the real sound source, said reverberation sound generation means having a microphone and a stage loudspeaker and causing a sound signal from the real sound source to undergo electric-acoustic feedback by utilizing the microphone and the stage loudspeaker.

17. A sound field control device as defined in claim 16, wherein the reverberation sound generation means generates a reverberation sound signal, and further comprising a matrix circuit for respectively mixing the reverberation sound signal generated by said reverberation sound generation means with each of the hypothetical reflected sound signals generated by said hypothetical reflected sound source synthesizing means and for supplying an added sound signal to each loudspeaker.

18. A sound field control device as defined in claim 17, wherein said matrix circuit comprises a delay circuit, a level adjusting circuit and an adder to perform functions including time matching, level adjustment, and mixing for the reverberation sound signal and the hypothetical reflected sound source signals.

19. A sound field control device as defined in claim 16, wherein the reverberation sound generation means generates a reverberation sound signal and the hypothetical reflected sound source signals and the reverberation sound signal are subjected to delay corresponding to time obtained by dividing the distances between a position of the real sound source and a position of each loudspeaker by sound velocity.

* * * * *